United States Patent
Malone

(10) Patent No.: US 7,214,131 B2
(45) Date of Patent: May 8, 2007

(54) AIRFLOW DISTRIBUTION CONTROL SYSTEM FOR USAGE IN A RAISED-FLOOR DATA CENTER

(75) Inventor: Christopher G. Malone, Loomis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 268 days.

(21) Appl. No.: 10/759,849

(22) Filed: Jan. 15, 2004

(65) Prior Publication Data

US 2005/0159099 A1 Jul. 21, 2005

(51) Int. Cl.
*H05K 5/00* (2006.01)
(52) U.S. Cl. .................. 454/184; 361/695; 361/696
(58) Field of Classification Search ................ 454/184, 454/255; 361/695, 694; 165/80.3, 104.33, 165/121, 122, 126
See application file for complete search history.

(56) References Cited

U.S. PATENT DOCUMENTS

| | | | | |
|---|---|---|---|---|
| 3,318,225 A | * | 5/1967 | May | 454/267 |
| 4,644,443 A | * | 2/1987 | Swensen et al. | 361/687 |
| 4,775,001 A | * | 10/1988 | Ward et al. | 165/214 |
| 5,321,581 A | | 6/1994 | Bartilson et al. | |
| 5,345,779 A | * | 9/1994 | Feeney | 62/259.2 |
| 5,410,448 A | | 4/1995 | Barker, III et al. | |
| 5,923,531 A | | 7/1999 | Bachman et al. | |
| 6,142,866 A | * | 11/2000 | Wright | 454/184 |
| 6,318,113 B1 | * | 11/2001 | Levy et al. | 62/426 |
| 6,414,828 B1 | * | 7/2002 | Zimmerman et al. | 361/1 |
| 6,574,104 B2 | * | 6/2003 | Patel et al. | 361/695 |
| 6,616,524 B2 | * | 9/2003 | Storck et al. | 454/184 |
| 6,672,955 B2 | * | 1/2004 | Charron | 454/184 |
| 6,694,759 B1 | * | 2/2004 | Bash et al. | 62/180 |
| 6,747,872 B1 | * | 6/2004 | Patel et al. | 361/695 |

FOREIGN PATENT DOCUMENTS

JP 08014642 1/1996

OTHER PUBLICATIONS

Kailash C. Karki; Suhas V. Patankar; Amir Radmehr, Techniques for Controlling Airflow Distribution in Raised-Floor Data Centers, Technical Conference and Exhibition Jul. 6-11, 2003, Maui, Hawaii, USA, pp. 1-8, Innovative Research, Inc. USA.

* cited by examiner

Primary Examiner—Derek S. Boles

(57) ABSTRACT

An airflow distribution control system for usage in a raised-floor data center comprises an under-floor partition with a controllable flow resistance and a sensor. The partition is capable of selective positioning in a plenum beneath the raised-floor. The sensor is communicatively coupled to the partition and detects a parameter indicative of airflow distribution and controls the flow resistance based on the parameter.

25 Claims, 7 Drawing Sheets

AIRFLOW DISTRIBUTION CONTROL SYSTEM FOR USAGE IN A RAISED-FLOOR DATA CENTER

BACKGROUND OF THE INVENTION

Electronic systems and equipment such as computer systems, network interfaces, storage systems, and telecommunications equipment are commonly cooled using a pressurized under-floor plenum. Hot air exhausted by electrical equipment in a data center room is drawn into Computer-Room Air Conditioning (CRAC) units via powerful fans in the CRAC units. The CRAC fans cool the hot air by forcing the air through a liquid-to-air heat exchanger. Pressurized cooling air then enters a plenum beneath the data center floor. Cooled air is distributed to the equipment in the room by placing floor tiles with perforations in close proximity to the cool air inlet vents of the equipment.

Typically, during final stages of a data center upgrade or new construction, airflow through the perforated tiles is measured to plan for sufficient cooling to meet expected room equipment heat loads. Adjustments are made to the quantity and placement of the perforated tiles and CRAC blower speed is to set a desired air flow rate. Control of changes in flow rate is difficult to achieve once deployment is complete. However, unintentional changes to flow rate are common. Over time, flow rates generally decrease due to addition of cables and other obstructions in the plenum. Holes in the plenum are often created for cable routing and can cause drastic changes to initial tile flow rates by creating low-resistance bypass for the high-pressure cooling air. Therefore, attaining a planned airflow distribution in the data center is difficult due to the complex nature of airflow and pressure distribution in the plenum.

Air exits from the CRAC at a very high velocity. At a distance from the CRAC units, air velocities are low and uniform. The combination of conditions often results in a non-intuitive and undesirable airflow distribution through the perforated tiles. Airflow is low or negative, drawing air from the data center into the plenum, near the CRAC unit. In contrast, airflow is higher distal from the CRAC unit.

SUMMARY

What are desired are a system and method that enable dynamic control of airflow in a raised-floor data center.

In accordance with various embodiments exemplified herein, an airflow distribution control system for usage in a raised-floor data center comprises an under-floor partition with a controllable flow resistance and a sensor. The partition is capable of selective positioning in a plenum beneath the raised-floor. The sensor is communicatively coupled to the partition and detects a parameter indicative of airflow distribution and controls the flow resistance based on the parameter.

According to other embodiments, an airflow control apparatus for usage in a raised-floor data center comprises a partition configured for under-floor installation, a plurality of adjustable apertures in the partition, and a servomotor. The servomotor is coupled to the apertures and can control flow resistance of the partition.

In accordance with additional embodiments, a ventilation system for a data center comprises a raised floor overlying a plenum space, at least one under-floor partition with a controllable flow resistance, and at least one sensor. The raised floor further comprises a plurality of tiles. The partitions are selectively positioned in the plenum beneath the raised-floor. The sensors are communicatively coupled to one or more partitions and detect a parameter indicative of airflow distribution and control flow resistance based on the parameter.

BRIEF DESCRIPTION OF THE DRAWINGS

Embodiments of the invention relating to both structure and method of operation, may best be understood by referring to the following description and accompanying drawings.

DETAILED DESCRIPTION

Various aspects of a ventilation system operate to control airflow distribution in a raised-floor data center by sensing a parameter indicative of airflow distribution and adjusting flow resistance distribution in a plenum under the raised floor based on the sensed parameter.

The ventilation system can implement airflow control either autonomously or manually and can adjust to conditions to supply cooling directly to a thermal source.

Figure 1:
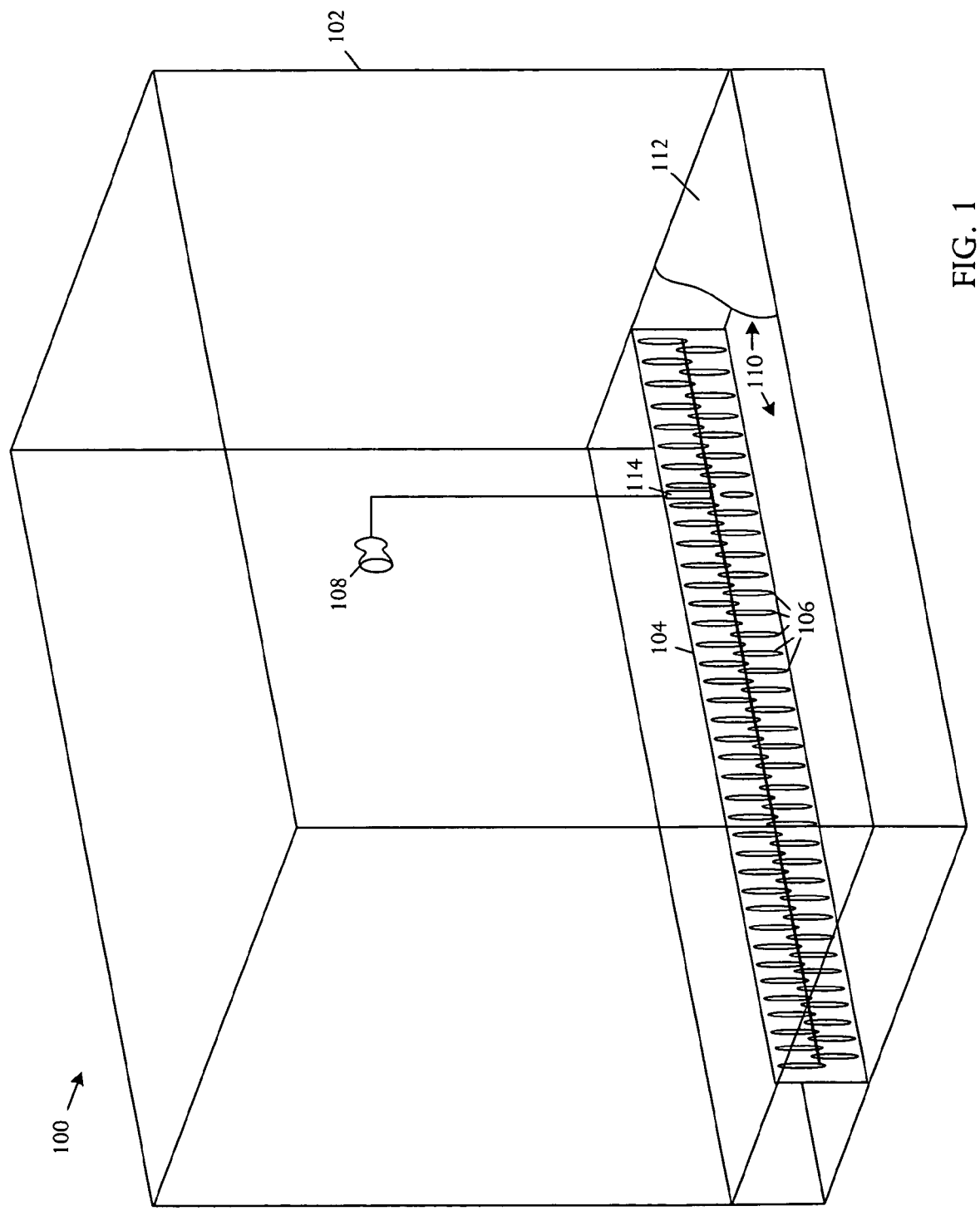
FIG. 1 is a simplified schematic pictorial diagram illustrating a cut-away view of an embodiment of an airflow distribution control system for usage in a raised-floor data center.

Referring to FIG. 1, a simplified schematic pictorial diagram illustrates a cut-away view of an embodiment of an airflow distribution control system 100 for usage in a raised-floor data center 102. The system 100 comprises an under-floor partition 104 with a controllable flow resistance 106. The airflow distribution control system 100 also comprises a sensor 108. The partition 104 can be selectively positioned in a plenum 110 beneath the raised-floor 112. The sensor 108 is communicatively coupled to the partition 104 and detects a parameter indicative of airflow distribution. The sensor 108 controls the flow resistance based on the parameter.

The sensor 108 can be any type of suitable air flow sensor or transducer, for example including airflow sensors, pressure sensors, and temperature sensors. In some embodiments, one or more of various transducer types can be used as sensors to detect parameters usable for controlling and modifying airflow distribution in the data center 102. Appropriate control parameters include air flow characteristics, pressure, temperature, and the like.

Some configurations can use an array of thermometers as the sensor 108, for example distributing the thermometers throughout the data center room 102. In various arrangements, one or more sensors 108 can be located in any appropriate location in the plenum 110 below the raised-floor and/or located in a suitable location above the floor in the data center room. In a particular example, a system 100 may include a sensor 108 located below each tile of the raised floor that is capable of measuring velocity and temperature. Walls or partitions 104 in the floor plenum 110 can be adjusted based on feedback from the sensors 108. Sensors 108 can otherwise be located in an electronics rack or in electronic equipment.

In other embodiments, the sensor 108 can be an air flow transducer of the type used for control, surveillance, and regulation of flow rate in fresh-air and ventilation systems. In a particular embodiment, an air flow transducer may register airflow speed according to the thermal principle that cooling action of air increases with airspeed. An airflow transducer can include temperature-dependent resistors manufactured using thin-film technology that creates radiant heat in the resistor substrate. Air flowing past the resistor shifts the radiant heat and creates a differential voltage at the resistors, which are connected to form a bridge. Electrical signals generated by the transducer indicate air flow and direction.

In the illustrative system 100, the controllable flow resistance 106 is shown as a plurality of adjustable apertures in the under-floor partition 104. A servomotor 114 is coupled to the apertures 106 and communicatively coupled to the sensor 108. The servomotor 114 responds to communication from the sensor 108 to open and close the apertures 106, thereby controlling flow resistance of the partition 104.

Figure 2:
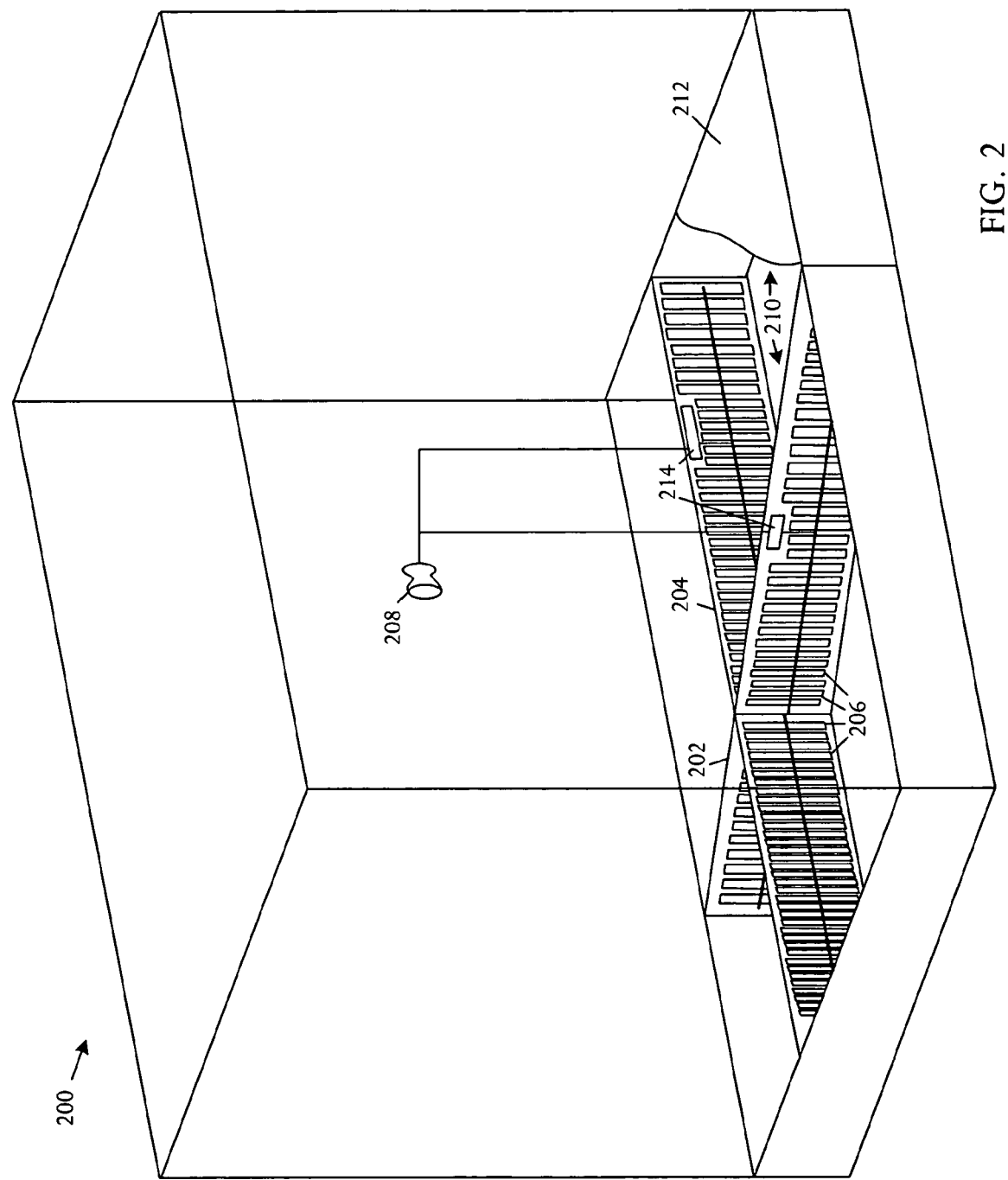
FIG. 2 is a simplified schematic pictorial diagram showing a cut-away view of another embodiment of an airflow distribution control system that includes a plurality of under-floor partitions.

Referring to FIG. 2, a simplified schematic pictorial diagram illustrates a cut-away view of another embodiment of an airflow distribution control system 200 that includes a plurality of under-floor partitions 202, 204 with controllable flow resistances 206. The partitions 202, 204 are selectively positioned in the plenum 210 under the floor 212 and are independently controllable by the sensor 208. In the illustrative embodiment, the various under-floor partitions 202, 204 have adjustable apertures 206 of varying sizes and densities to function as controllable air flow resistances.

In the particular example, the apertures 206 are configured as a plurality of louvered shutters in the under-floor partitions 202, 204. A servomotor 214 is coupled to the louvered shutters 206 and in communication with the sensor 208. The servomotor 214 responds to communication from the sensor 208 to control flow resistance of the partitions 202, 204.

The airflow distribution control system 200 enables autonomous and/or manual control of air flow distribution in a raised-floor data center by adding vertical or otherwise arranged partitions 202, 204 with controllable flow resistances 206 to the under-floor plenum 210. The sensor 208 measures a parameter indicative of airflow distribution in the room. The sensed parameter is used to balance air flow distribution to match thermal loads imposed by data center equipment. In some arrangements or in some conditions, the sensed parameter is applied to a controller that activates an automatic response. Alternatively, the sensed parameter can be displayed, enabling manual control of the controllable airflow resistances 206.

Conditions in the data center vary over time and the airflow distribution control system 200 responds to the variations in thermal loads to accommodate variations in environmental conditions, addition or removal of equipment, adapt for intrusions into the plenum such as drilling of holes in the floor or insertion of cables into the plenum 210.

An air conditioning system injects air into the plenum 210, generating a pressure distribution under the floor 212. The partitions 202, 204 with controllable airflow resistances 206 modify the pressure and airflow distribution in the plenum 210, thereby controlling the distribution above the floor 212 to adapt to conditions in the data center.

Figure 3A:
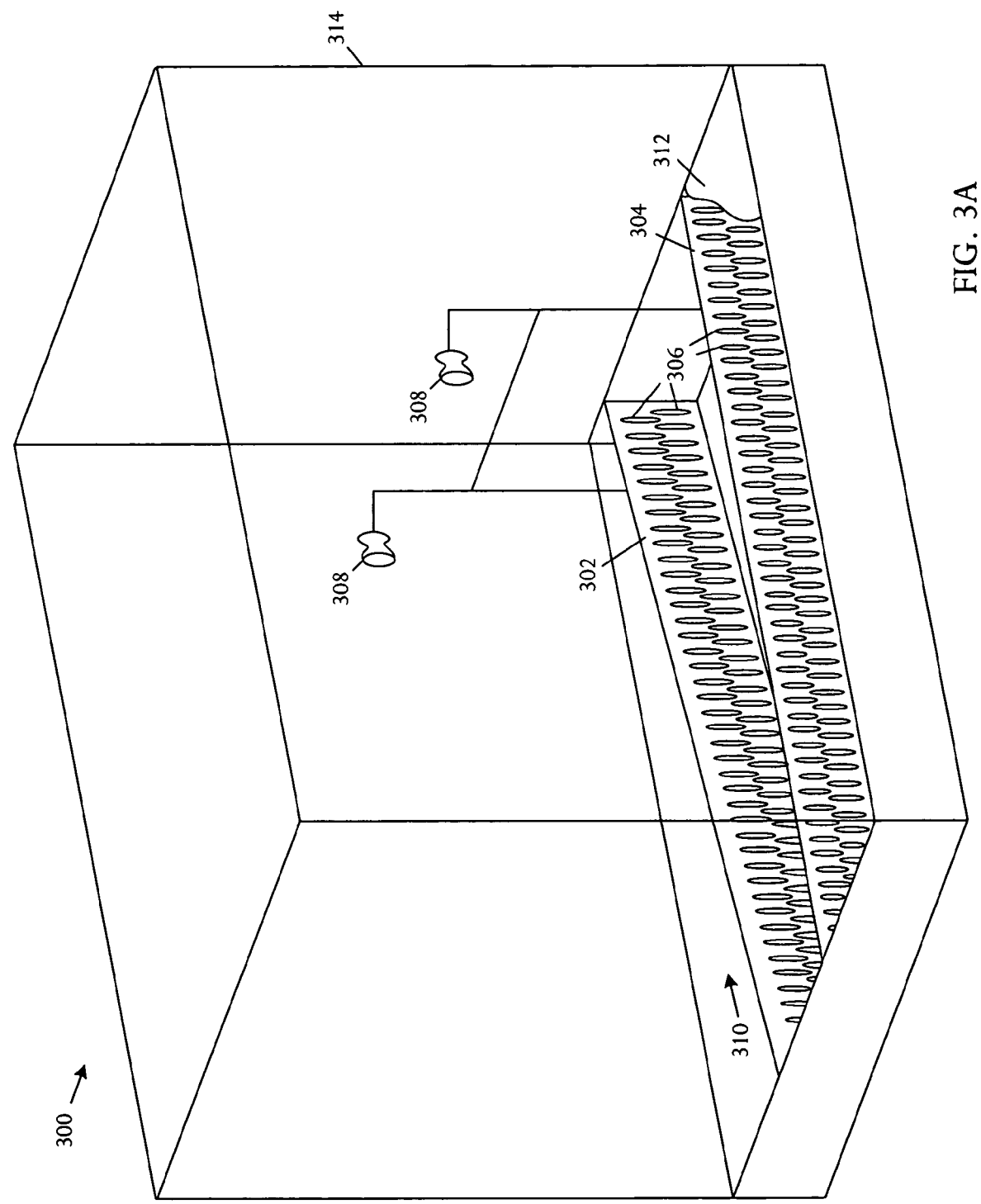
FIGS. 3A, 3B, and 3C are simplified schematic pictorial diagrams depicting cut-away views of some embodiments of an airflow distribution control system that include multiple under-floor partitions.

Referring to FIG. 3A, a simplified schematic pictorial diagram illustrates a cut-away view of an embodiment of an airflow distribution control system 300 that includes a plurality of under-floor partitions 302, 304, each with controllable flow resistances 306 to create a converging channel with an area that decreases from the center-line of the data center room 314. The partitions 302, 304 are selectively positioned in the plenum 310. A network of distributed sensors 308 is arranged in the data center room 314 and is communicatively coupled to the plurality of under-floor partitions 302, 304. The sensor network 308 can control the air flow resistance of the partitions 302, 304 independently. For example, in some embodiments and/or in some circumstances or conditions, the flow resistance of one partition 302 may be controlled independently of the other partition 304. In other embodiments and/or circumstances or conditions, the various flow resistances 306 can be controlled independently of one another.

Figure 3B:
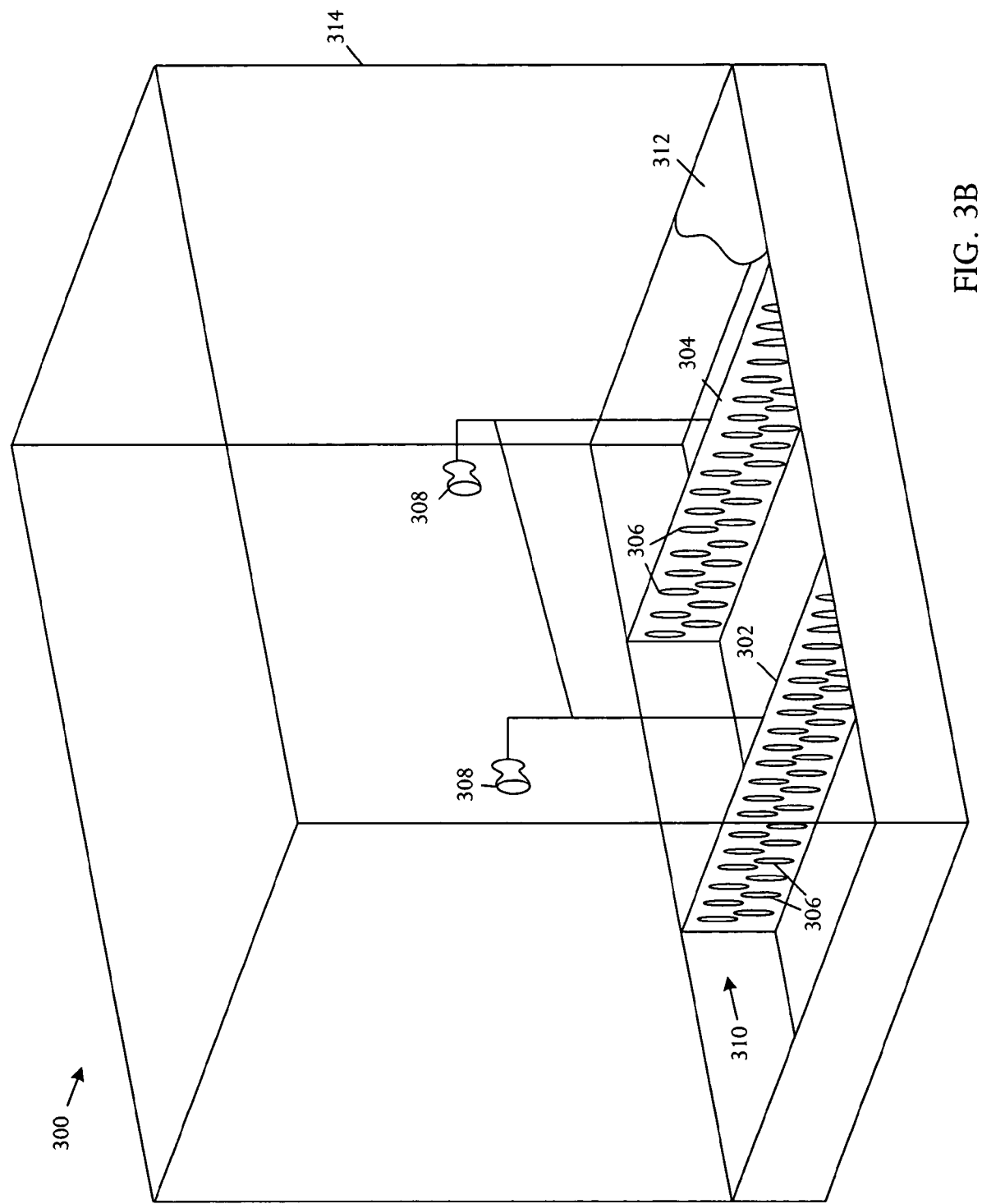

FIG. 3B illustrates an embodiment of an airflow distribution control system 300 with under-floor partitions 302 and 304 that extend in a line across the data center 314 and divide the room into three sections. The impingement of flow on the partitions 302, 304 produces higher pressures on the upstream side with respect to the air conditioning source, and produces a reduction in pressure across the partitions 302, 304. In the illustrative system 300 the apertures forming the flow resistance 306 are arranged to be larger for the partition 304 more distant from the air source.

Figure 3C:
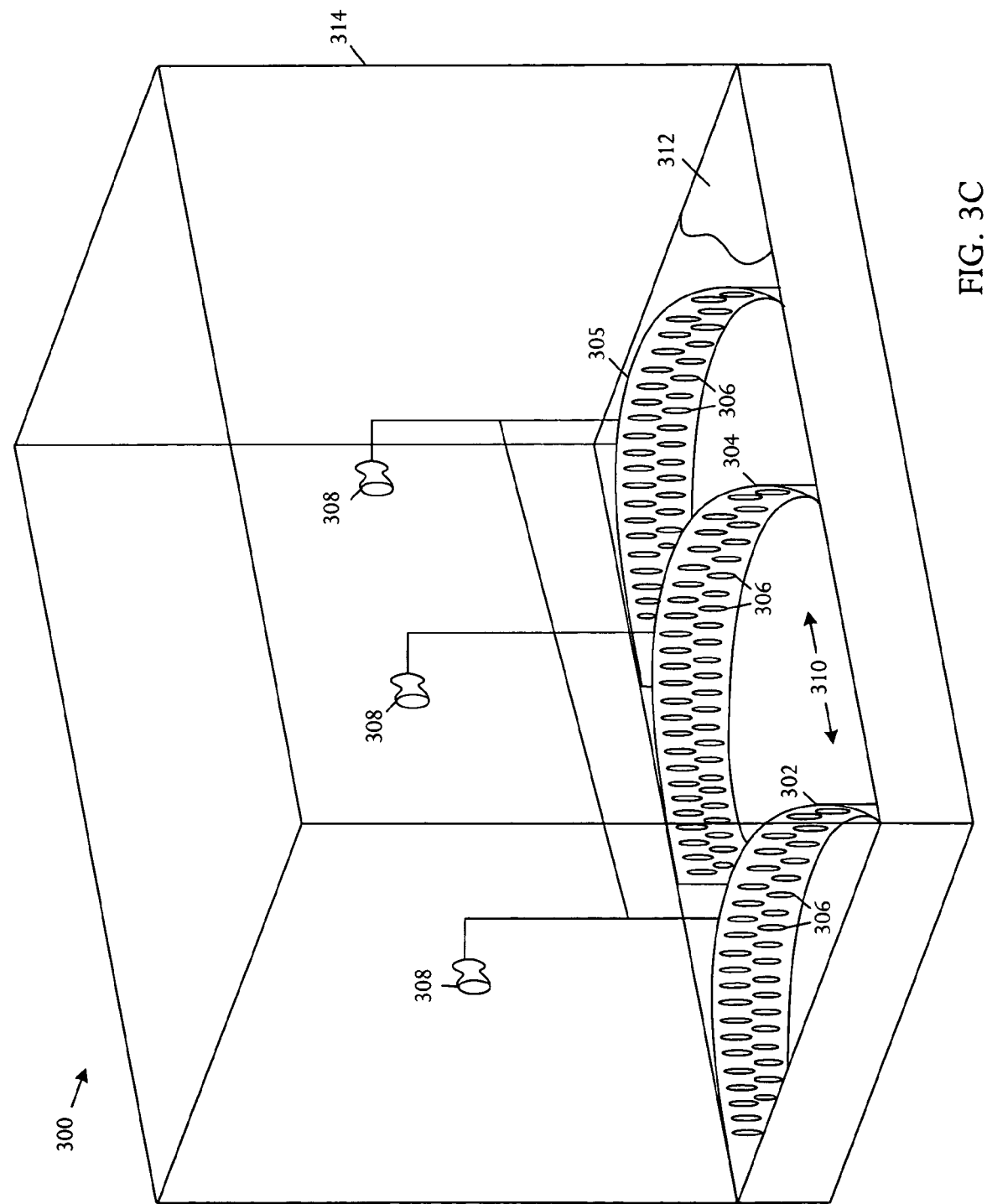

FIG. 3C illustrates an embodiment of an airflow distribution control system 300 with under-floor partitions 302, 304, 305 that extend in across the data center 314 in radial arcs centered at the air conditioner and divide the room into four sections.

The partitions can extend into the plenum 310 at various angles. In some cases the partitions can be vertical or any angle from horizontal to obtain a desired effect on air flow. Multiple partitions can be arranged in any suitable geometry under the floor 312 to obtain a desired pressure and air flow movement profile. In some examples, the partitions can be arranged to intersect in a grid configuration. In other examples, the partitions can be aligned in parallel. Partitions can be arranged according to a planned or expected floor plan configuration of equipment above the floor.

In a particular embodiment, the grid concept can be extensible to include a two foot by two foot flooring arrangement in which 2×2 floor tiles are distributed over vertical walls aligned at edges of the tiles.

Figure 4:
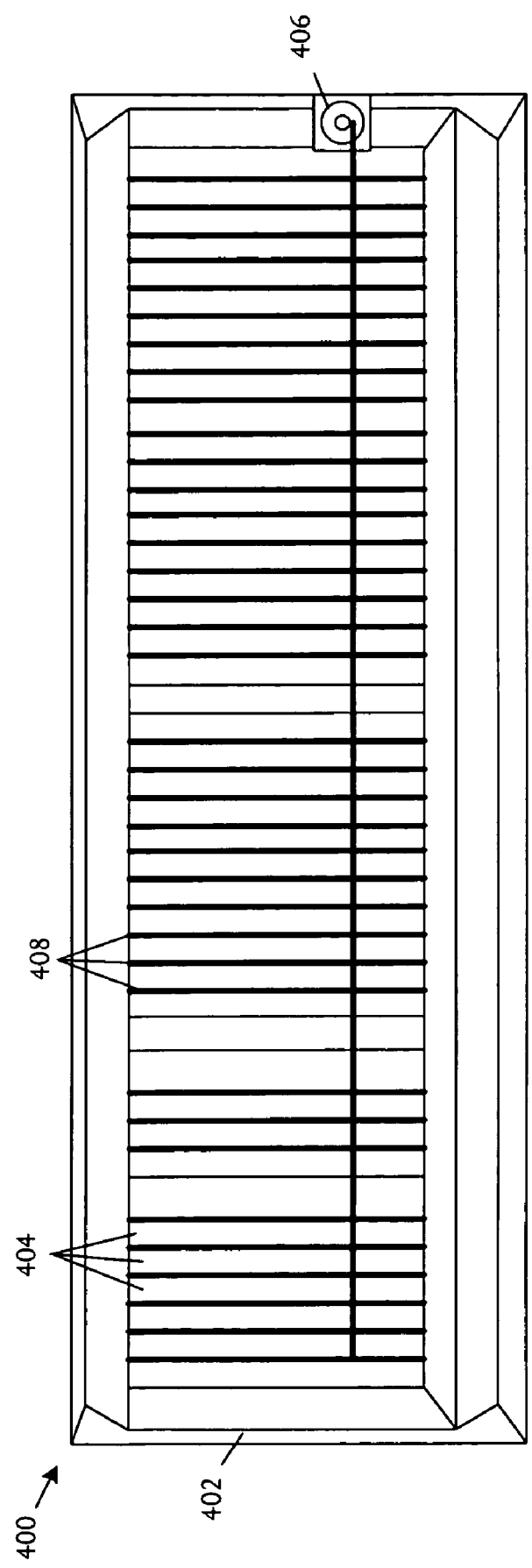
FIG. 4 is a schematic pictorial diagram illustrating an embodiment of an airflow control apparatus for usage in a raised-floor data center.

Referring to FIG. 4, a schematic pictorial diagram illustrates an embodiment of an airflow control apparatus 400 for usage in a raised-floor data center. The airflow control apparatus 400 comprises a partition 402 configured for under-floor installation, a plurality of adjustable apertures 404 in the partition 402, and a servomotor 406. The servomotor 406 is coupled to the apertures 404 and adjusts positioning of deflecting blades 408 that cover the apertures 404, thereby controlling flow resistance of the partition 402.

The illustrative airflow control apparatus 400 includes a plurality of louvered shutters in the partition 402. In some embodiments, a partition 402 can have a plurality of adjustable apertures 404 of varying sizes and densities. Some partitions may have multiple server motors 406 so that different portions of the partition 402 can be managed to have different flow resistance concurrently.

Figure 5:
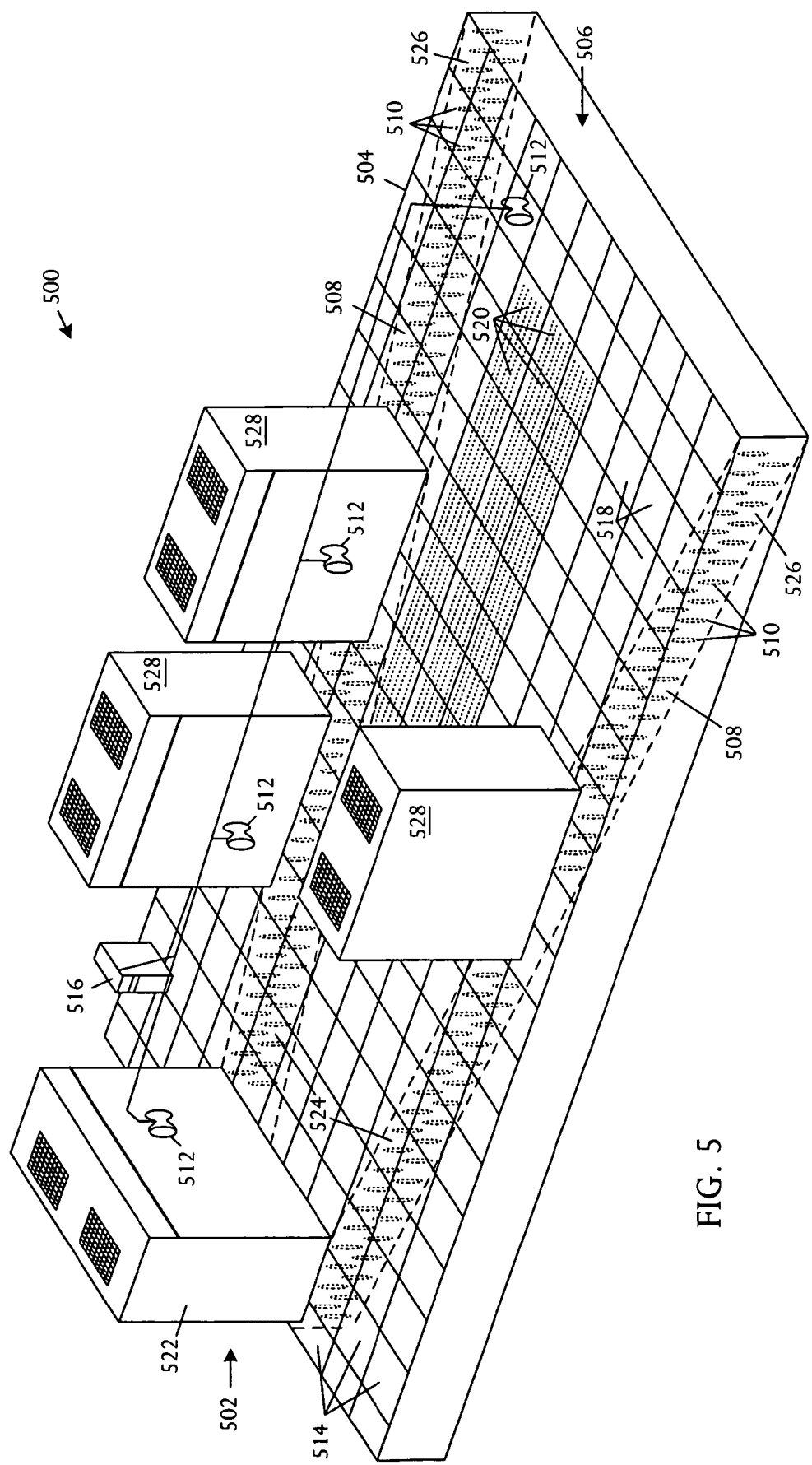
FIG. 5 is a perspective pictorial diagram illustrates an embodiment of a ventilation system that can be used in a data center.

Referring to FIG. 5, a perspective pictorial diagram illustrates an embodiment of a ventilation system 500 that can be used in a data center 502. The ventilation system 500 comprises a raised floor 504 overlying a plenum space 506 and one or more under-floor partitions 508 with controllable flow resistance 510. One or more sensors 512 are distributed in selected locations in the data center 502. The raised floor 504 further comprises a plurality of tiles 514. The partitions 508 are selectively positioned in the plenum 506 beneath the raised floor 504. The sensors 512 are communicatively coupled to one or more partitions 508 and detect a parameter indicative of airflow distribution. A controller 516 receives signals from the sensors 512 and controls flow resistance based on the parameter.

The raised-floor tiles 514 include solid tiles 518 and perforated tiles 520 that are selectively arranged to manage airflow from the plenum space 506 to the data center 502 above the raised floor 504.

The ventilation system 500 further comprises at least one air conditioning unit 522 that is arranged to inject cooling air into the plenum 506. In some embodiments, the ventilation system 500 includes multiple under-floor partitions 508 arranged in a series so that partitions 524 with higher flow resistance are positioned generally more proximal to the air conditioning unit 522 and partitions 526 with lower flow resistance are positioned generally more distal to the air conditioning unit. Because air velocity is at a maximum near the CRAC, pressure is at a minimum. As velocities decrease, pressure increases. The walls are intended to increase pressure near the CRAC. Higher flow resistance walls are located near the CRAC.

The arrangement of resistances is highly variable depending on the particular environment. Some room configurations may indicate an opposite arrangement, for example if all information technology (IT) equipment is near the CRAC. However, generally uniform velocities are desired in the under floor plenum.

In an illustrative embodiment, the multiple under-floor partitions 508 can be arranged in a selected pattern in which individual partitions have flow resistance that is controllable independently of other partitions. The under-floor partitions 508 can have adjustable apertures of varying sizes and densities.

The sensors 512 are selectively distributed in the data center 502 and a process executable in the controller 516 takes into account the spatial sensor distribution to determine a spatial distribution of the parameter indicative of airflow distribution. Based on the airflow distribution signals from one or more of the sensors, the controller generates control signals to adjust flow resistance among the plurality of partitions 518. The controller 516 can control specific partitions or sections of partitions independently based on the parameter spatial distribution.

The controller 516 adjusts flow resistance among the multiple under-floor partitions 508 by adjusting apertures of varying sizes and densities.

The controller 516 receives signals from the sensors 512 and processes the received signals to determine flow resistance settings for the partitions 508 that are suitable for controlling air flow in the data center 502. In an illustrative embodiment, the flow resistance control device 510 is a plurality of adjustable apertures 510 in the under-floor partition 508. For example, a servomotor can be coupled to the apertures 510 to set the aperture size based on commands received from the controller 516. Controller commands are determined based on signals received by the controller 516 from the sensors 512. The controller 516 executes a process that tracks sensor information over time and determines appropriate flow resistance settings to control flow resistance in the data center 502.

In a particular embodiment, the flow resistance 510 can be multiple louvered shutters in one or more of the under-floor partition 508 with a servo motor coupled to the louvered shutters. The controller 516 can execute a process that tracks sensor data over time and generates servo motor commands to manage positioning of dampers or blades in the louvered shutters to control flow resistance.

The sensors 512 are arranged in a network and send signals to the controller 516 including information relating to a parameter indicative of air flow and information enabling the controller 516 to determine the position of the measurement in the data center 502. Spatial information acquired by the network of distributed sensors 512 are communicated to the controller 516, which processes the information and determines settings for controlling flow resistance in the plenum 506. Flow resistance may be controlled independently for individual partitions and for particular segments of partitions.

The sensors 512 can be distributed in computers, system racks, and in other strategic locations in the data center 502 as appropriate to supply airflow condition signals for controlling the airflow resistance in the plenum 506.

Various types of sensors 512 can be used for a particular ventilation system 500 such as sensors, pressure sensors, temperature sensors, and the like. In a particular ventilation system 500 the network of sensors 512 can include uniform sensors of all one type, or can include a mixture of particular sensors and sensor types.

The illustrative ventilation system 500 operates to control airflow distribution in the data center 502 holding various electronic equipment 528. The data center 502 has a hot aisle-cold aisle arrangement with the air conditioning unit 522 and the perforated tiles 520 in the cold aisles. Equipment 528 such as computer servers are arranged on two sides of the cold aisles with air intake sides facing the cold aisles. The air exhaust exits of the equipment 528 face hot aisles. The air conditioning unit 522 injects cooling air into the plenum 506, which exits the perforated tiles 520 and is pulled into the equipment 528 by fans internal to the equipment. The equipment 528 heats the cooled air during operations and exhausts the hot air rearward into the hot aisles. The heated exhaust returns to inlets of the air conditioning unit 522.

The controller 516 can dynamically respond to conditions measured by the sensors 512 to control airflow. For example, the controller 516 can adjust the flow resistance 510 in particular partitions 508 and/or or particular sections of the partitions 508. The controller 516 adjusts flow resistance among the plurality of partitions 508 independently based on the sensed parameter or parameters. In general, the controller 516 can open partition apertures to lower resistance in a particular location to cause additional airflow to a region and, conversely, can close apertures to reduce local airflow.

Implementation of partitions 508 with controllable flow resistances 510 to the plenum 506 enables increased flexibility in attaining desired flow rates through the perforated floor tiles 520.

The dynamic capabilities of the ventilation system 500 enable adjustment to large variations in thermal conditions resulting from presence of service or construction personnel in the data center 502, addition or removal or equipment units, changes occurring during construction of the data center 502.

Usage of the distributed sensors 512 enables the controller 516 to respond dynamically to changes in local conditions in specific locations in the data center 502, for example to increase airflow in the vicinity of a particular equipment unit in response to increased heat production by the unit. Similarly, the controller 516 can decrease airflow to a region when a particular equipment unit is turned off or removed. The ventilation system 500 permits flexible changes in airflow in response to changes in data center environment caused by equipment changes or failure of system-level cooling or computer-room air conditioning units. The under-floor partitions 508 can be controlled in response to an air conditioning unit failure by using a feedback loop from the sensors 512 to the control the adjustable resistance 510 to close flow to isolate the failed unit. Resistance adjustments may be made manually or by servo motor control based on feedback of parameters such as temperature, airflow, and/or pressure. For example, temperature data may be accessed from temperature feedback from information technology systems, room temperatures, or computer-room air conditioning air temperatures, either supply or return.

The ventilation system 500 enables cooling air to be used effectively in an underutilized data center. Often, a fraction of the floor space of a new data center is filled with equipment since enterprises typically begin operations with excess capacity to allow for growth. Given the large capital costs associated with data center construction, the housed building is constructed to accommodate further information technology expansion of system criteria. In general operation, the entire under-floor plenum is pressurized, regardless of floor usage. Often computer-room air conditioning units are operated to properly pressurize the plenum to deliver an appropriate amount of cooling air to the room equipment. The partitions 508 with adjustable resistances 510 can be installed during a construction phase, permitting the plenum 506 to be subdivided based on floor utilization. Computer room air conditioning units can be installed during a construction phase, enabling the plenum to be sub-divided based on floor utilization. Resources can be conserved by waiting to activate a computer room air conditioning unit until the previously activated units can no longer supply sufficient cooling.

The partitions 508 with adjustable resistances 510 can also be used to prevent or avoid loss of cooling airflow caused by intrusions, for example insertion of bulky items or cables, into the pressurized plenum. Control of airflow is also useful in response to changes in pressure, and thus disturbances in airflow, caused by removal of tiles from the data center floor during maintenance or by improper installation of a floor grid, creating a low-pressure by-pass of cooling air. Disturbances in airflow can result in insufficient receipt of cooling air in other parts of the data center, potentially causing system failure.

The ventilation system 500 system also enable isolation of failed computer room air conditioning units from the remainder of the plenum, preventing air bypass through the air conditioning unit. Cut-outs in the data center floor tiles are commonly used to route cabling from an equipment unit rack into the plenum, creating low-pressure bypasses. The adaptive ventilation system 500 can isolate floor areas containing cut-outs from the plenum using the partitions 508. Resistances can be adjusted manually or through usage of a servo motor control process.

The various functions, processes, methods, and operations performed or executed by the system can be implemented as programs that are executable on various types of processors, controllers, central processing units, microprocessors, digital signal processors, state machines, programmable logic arrays, and the like. The programs can be stored on any computer-readable medium for use by or in connection with any computer-related system or method. A computer-readable medium is an electronic, magnetic, optical, or other physical device or means that can contain or store a computer program for use by or in connection with a computer-related system, method, process, or procedure. Programs can be embodied in a computer-readable medium for use by or in connection with an instruction execution system, device, component, element, or apparatus, such as a system based on a computer or processor, or other system that can fetch instructions from an instruction memory or storage of any appropriate type. A computer-readable medium can be any structure, device, component, product, or other means that can store, communicate, propagate, or transport the program for use by or in connection with the instruction execution system, apparatus, or device.

The discussion depicts process acts that may represent modules, segments, or portions of code that include one or more executable instructions for implementing specific logical functions or steps in the process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of partitions and devices for adjusting airflow resistance in the partitions are described. The illustrative techniques can be used with any suitable type, geometry, or configuration of partition and flow control devices. Automatic embodiments disclose usage of a servo motor to control positioning of blades or other covers of apertures in the partition. Any suitable type of motor and any appropriate resistance adjustment device may be used. Particular sensed parameters include airflow, pressure, and temperature. Any suitable parameter that is indicative of airflow, such as motion detectors and the like, may otherwise be used.

What is claimed is:

1. An airflow distribution control system for usage in a raised-floor data center comprising;
    an under-floor partition with an adaptively controllable flow resistance, the partition being adapted constructed into a plenum beneath the raised-floor in selected positions;
    a sensor communicatively coupled to the partition that detects a parameter indicative of airflow distribution in the data center, tracks the parameter over time, and adaptively controls the flow resistance beneath the raised floor based on the tracked changes in the parameter to balance air flow distribution to match thermal loads imposed by data center equipment;
    a plurality of under-floor partitions with controllable flow resistances, the partitions being selectively positioned in the plenum;

a network of distributed sensors communicatively coupled to the plurality of under-floor partitions; and a controller coupled to the distributed sensor network and the controllable flow resistances, the controller adapted to determine a spatial distribution of at least one parameter sensed by the sensor network, track the determined spatial distribution over time, and automatically control flow resistances in the plurality of partitions mutually independently based on changes in tracked spatial distribution.

2. The system according to claim 1 further comprising:
a plurality of adjustable apertures in the under-floor partition; and
a servomotor coupled to the apertures and the sensor, the servomotor responsive to communication from the sensor to control flow resistance of the partition.

3. The system according to claim 1 further comprising:
a plurality of louvered shutters in the under-floor partition; and
a servomotor coupled to the louvered shutters and the sensor, the servomotor responsive to communication from the sensor to control flow resistance of the partition.

4. The system according to claim 1 further comprising:
a plurality of under-floor partitions with controllable flow resistances constructed into the raised floor, the partitions being selectively positioned in the plenum and independently controllable by the sensor.

5. The system according to claim 1 wherein:
the plurality of under-floor partitions has adjustable apertures of varying sizes and densities.

6. The system according to claim 1 wherein:
the sensor is selected from among a group consisting of airflow sensors, pressure sensors, and temperature sensors.

7. An airflow control apparatus for usage in a raised-floor data center comprising:
a partition constructed into and beneath the raised-floor;
a plurality of adjustable apertures in the partition adapted for automatic and dynamic control of airflow resistance under the raised-floor;
a servomotor coupled to the apertures and adapted to dynamically control flow resistance of the partition to adjust air flow distribution under the raised-floor according to dynamic environmental changes within the data center;
a plurality of under-floor partitions with controllable flow resistances, the partitions being selectively positioned in the plenum;
a network of distributed sensor communicatively coupled to the plurality of under-floor partitions; and
a controller coupled to the distributed sensor network and the controllable flow resistances, the controller adapted to determine a spatial distribution of at least one parameter sensed by the sensor network, track the determined spatial distribution over time, and automatically control flow resistances in the plurality of partitions mutually independently based on changes in tracked spatial distribution.

8. The apparatus according to claim 7 further comprising:
a plurality of louvered shutters in the partition; and
a the controller coupled to the louvered shutter plurality and adapted to dynamically and automatically control the louvered shutters to adjust air flow distribution under the raised-floor.

9. The apparatus according to claim 7 further comprising:
a plurality of adjustable apertures of varying sizes and densities in the partition.

10. A ventilation system for a data center comprising:
a raised floor overlying a plenum space and further comprising a plurality of tiles;
at least one under-floor partition with a controllable flow resistance, the partitions being constructed into the raised floor in the plenum beneath the raised floor;
at least one sensor communicatively coupled to the at least one partition, the at least one sensor that detect a parameter indicative of airflow distribution in the data center and dynamically control the flow resistance beneath the raised-floor based on the parameter to balance air flow distribution to track and adjust to variations in thermal loads imposed by data center equipment;
a network of distributed sensors communicatively coupled to the plurality of under-floor partitions, the sensor network that automatically and dynamically controls the plurality of partitions mutually independently to determine a spatial distribution of at least one parameter sensed by the sensor network, track the determined spatial distribution over time, automatically control flow resistances in the plurality of partitions mutually independently based on changes in tracked spatial distribution, and adjust to dynamic changes in thermal loads imposed by data center equipment.

11. The system according to claim 10 wherein:
the plurality of raised floor tiles include solid tiles and perforated tiles selectively arranged to manage airflow.

12. The system according to claim 10 further comprising:
at least one air conditioning unit arranged to inject cooling air into the plenum; and
a plurality of under-floor partitions constructed into the raised floor and arranged in a series so that partitions with higher flow resistance are positioned generally more proximal to the air conditioning unit and partitions with lower flow resistance are positioned generally more distal to the air conditioning unit.

13. The system according to claim 10 further comprising:
a plurality of under-floor partitions constructed into the raised floor and arranged in a selected pattern wherein ones of the partitions have flow resistance that is dynamically controllable independently of other partitions.

14. The system according to claim 10 further comprising:
a plurality of adjustable apertures in ones of the at least one under-floor partition; and
a servomotor coupled to the apertures and the sensor, the servomotor being responsive to communication from the sensor to dynamically control flow resistance beneath the raised floor.

15. The system according to claim 10 further comprising:
a plurality of louvered shutters in ones of the at least one under-floor partition; and
a servomotor coupled to the louvered shutters and the sensor, the servomotor responsive to communication from the sensor to control flow resistance beneath the raised floor.

16. The system according to claim 10 wherein:
at least one under-floor partitions has adjustable apertures of varying sizes and densities.

17. The system according to claim 10 wherein:
the sensor is selected from among a group consisting of airflow sensors, pressure sensors, and temperature sensors.

18. An airflow control apparatus for usage in a raised-floor data center comprising:
- means distributed in an under-floor plenum for dynamically sensing and tacking over time a parameter indicative of airflow distribution in the data center;
- means distributed in the underfloor plenum for dynamically adjusting flow resistance distribution in a plenum under the raised floor based on the sensed parameter to balance air flow distribution to dynamically and automatically adjust to changes in thermal loads imposed by data center equipment;
- means coupled to the dynamically sensing and tracking means and the dynamically adjusting means for determining a spatial distribution of at least one parameter sensed by the sensor network, tracking the determined spatial distribution over time, and automatically controlling flow resistances mutually independently based on changes in tacked spatial distribution.

19. A cooling system for usage in a raised-floor data center comprising:
- at least one Computer-Room Air Conditioning (CRAC) unit configured to supply cooling fluid to equipment in the data center;
- a under-floor plenum in fluid communication with the at least one CRAC unit;
- at least one under-floor partition constructed into and under the data center raised-floor in selected positions, the partition further comprising a controllable flow resistance distributed over the at least one under-floor partition;
- a network of sensors distributed in the data center and adapted to track variations in airflow distribution in the data center over time; and
- a controller coupled to the distributed controllable flow resistance and the distributed sensor network, the controller adapted to determine a spatial distribution of at least one parameter sensed by the sensor network, track the determined spatial distribution over time, automatically control flow resistances in the plurality of partitions mutually independently based on changes in tacked spatial distribution, and balance air flow distribution to adjust to changes in thermal loads imposed by the data center equipment over time.

20. The cooling system according to claim 19 further comprising:
- the controllable flow resistance, the sensor plurality, and the controller configured to dynamically detect and respond to variations in thermal conditions resulting from presence of personnel in the data center, and addition, removal, and failure of data center equipment units.

21. The cooling system according to claim 19 further comprising:
- the controller adapted to dynamically increase airflow to a region of the data center with a detected high thermal load and to dynamically decrease airflow to a region of the data center with a detected low thermal load.

22. The cooling system according to claim 19 further comprising:
- the controllable flow resistance and the controller adapted to control the controllable flow resistance dynamically and independently for particular partitions and for particular segments of partitions.

23. The cooling system according to claim 19 further comprising:
- the sensor plurality selectively distributed spatially in the data center and the controller adapted to account for the sensor plurality spatial distribution to determine an airflow spatial distribution.

24. The cooling system according to claim 19 further comprising:
- the, controllable flow resistance, the sensor plurality, and the controller configured to dynamically detect and respond to variations in thermal conditions resulting from intrusions into the under-floor plenum.

25. The cooling system according to claim 19 further comprising:
- the sensor plurality are selectively distributed including zero or more airflow sensors, zero or more pressure sensors, and zero or more temperature sensors.

* * * * *

UNITED STATES PATENT AND TRADEMARK OFFICE
CERTIFICATE OF CORRECTION

PATENT NO. : 7,214,131 B2  Page 1 of 1
APPLICATION NO. : 10/759849
DATED : May 8, 2007
INVENTOR(S) : Christopher G. Malone It is certified that error appears in the above-identified patent and that said Letters Patent is hereby corrected as shown below:

In column 8, line 53, in Claim 1, delete "comprising;" and insert -- comprising: --, therefor.

In column 9, line 52, in Claim 7, delete "sensor" and insert -- sensors --, therefor.

In column 9, line 64, in Claim 8, delete "a" before "the controller".

In column 11, line 4, in Claim 18, delete "tacking" and insert -- tracking --, therefor.

In column 11, line 18, in Claim 18, delete "tacked" and insert -- tracked --, therefor.

In column 11, line 41, in Claim 19, delete "tacked" and insert -- tracked --, therefor.

In column 12, line 31, in Claim 24, delete "the," and insert -- the --, therefor.

Signed and Sealed this

Ninth Day of September, 2008

JON W. DUDAS
*Director of the United States Patent and Trademark Office*